(12) United States Patent
Yoo et al.

(10) Patent No.: US 10,301,715 B2
(45) Date of Patent: May 28, 2019

(54) MASK FOR DEPOSITION AND MANUFACTURING METHOD THEREOF

(71) Applicant: LG DISPLAY CO., LTD., Seoul (KR)

(72) Inventors: MyungJae Yoo, Paju-si (KR); HyunTaek Lim, Paju-si (KR); Huiseong Yu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/669,095

(22) Filed: Aug. 4, 2017

(65) Prior Publication Data

US 2018/0148823 A1     May 31, 2018

(30) Foreign Application Priority Data

Nov. 30, 2016  (KR) .................. 10-2016-0161162

(51) Int. Cl.
    C23C 14/04     (2006.01)
    B23K 26/24    (2014.01)
    C23C 18/16    (2006.01)
    B05C 21/00    (2006.01)
    C25D 1/08      (2006.01)
    C25D 1/10      (2006.01)

(52) U.S. Cl.
    CPC .......... *C23C 14/042* (2013.01); *B05C 21/005* (2013.01); *B23K 26/24* (2013.01); *C23C 18/1633* (2013.01); *C25D 1/08* (2013.01); *C25D 1/10* (2013.01)

(58) Field of Classification Search
    None
    See application file for complete search history.

(56) References Cited

U.S. PATENT DOCUMENTS

| | | | |
|---|---|---|---|
| 2004/0020435 A1* | 2/2004 | Tsuchiya | C23C 14/042 118/723 VE |
| 2011/0229633 A1* | 9/2011 | Hong | H01L 51/0011 427/162 |
| 2012/0060756 A1* | 3/2012 | Ookawara | C23C 14/042 118/504 |

\* cited by examiner

*Primary Examiner* — Jethro M. Pence
(74) *Attorney, Agent, or Firm* — Polsinelli PC

(57) ABSTRACT

A mask for deposition and a manufacturing method thereof are disclosed in aspects of the present disclosure. The disclosed mask for deposition and the manufacturing method thereof include: a deposition part including a plurality of deposition patterns; a peripheral part configured to surround the outside of the deposition part; and at least one extending part provided at the boundary between the deposition part and the peripheral part, wherein the extending part has a thickness smaller than that of the peripheral part. Accordingly, it is possible to enhance the strength of the boundary portion between the peripheral part and the deposition part of the mask for deposition.

13 Claims, 14 Drawing Sheets

MASK FOR DEPOSITION AND MANUFACTURING METHOD THEREOF

CROSS REFERENCE TO RELATED APPLICATION

This application claims priority from Korean Patent Application No. 10-2016-0161162, filed on Nov. 30, 2016, which is hereby incorporated by reference in its entirety for all purposes as if fully set forth herein.

BACKGROUND

Field of the Disclosure

The present disclosure relates to a manufacturing apparatus for thin film devices including a display device, and more particularly to a mask for deposition and a manufacturing method thereof.

Description of the Related Art

With the development of the information-oriented society, new image display devices have been required to solve shortcomings of conventional cathode ray tubes (CRTs), such as heavy weight, large volume, and the like. Accordingly, various types of flat panel displays have drawn attention, such as a liquid crystal display (LCD), an organic light emitting diode (OLED) display, a plasma display panel (PDP), a surface-conduction electron emitter display (SED), and the like.

These displays have at least one substrate on which a plurality of fine patterns are formed. In order to form the fine patterns, a deposition process using a mask is required.

In general, a mask used in a deposition process is used as a mask assembly that includes a mask and a mask frame welded to one surface of the mask. When the mask and the mask frame are welded together, the mask may burst due to the small thickness (10 μm) thereof, and thus there is a difficulty in welding the mask to the mask frame.

Furthermore, due to the small thickness of the mask, the region of the mask to which a laser is applied may be thermally deformed when the mask and the mask frame are welded together using the laser. The thermal deformation of the mask may cause a deformation of the deposition part and the deposition patterns of the mask, which may lead to deterioration in the precision of a film to be deposited. Moreover, due to the thermal deformation of the mask, a gap may be formed between the mask and a substrate for deposition, which causes a shadow effect.

Accordingly, a mask capable of solving these problems is required.

SUMMARY OF THE DISCLOSURE

Accordingly, the present disclosure is directed to a mask for deposition and a manufacturing method thereof that substantially obviate one or more problems due to limitations and disadvantages of the prior art.

More specifically, the present disclosure is to solve such problems of bursting and thermal deformation that take place when a mask is welded to a mask frame.

According to an aspect of the present disclosure, a mask for deposition and a manufacturing method thereof include a deposition part including a plurality of deposition patterns. Further, the mask for deposition and the manufacturing method thereof, include a peripheral part configured to surround the outside of the deposition part. Moreover, the mask for deposition and the manufacturing method thereof include at least one extending part provided at the boundary between the deposition part and the peripheral part. Also, the mask for deposition and the manufacturing method thereof include a welding line located on the peripheral part. In addition, the extending part may have a thickness smaller than that of the peripheral part in the mask for deposition and the manufacturing method thereof.

According to another aspect of the present disclosure, a mask for deposition and a manufacturing method thereof include forming first and second patterned electrodes on a substrate. Further, the mask for deposition and the manufacturing method thereof include forming a photoresist pattern with an inverted tapered shape on the region of the substrate where the plurality of patterned electrodes are not disposed. Furthermore, the mask for deposition and the manufacturing method thereof include primarily plating only the first patterned electrode, which is disposed on the periphery of the substrate, with a mask material. Moreover, the mask for deposition and the manufacturing method thereof include secondarily plating the first and second patterned electrodes with the mask material. Also, the mask for deposition and the manufacturing method thereof include welding a mask frame to one surface of the mask material formed on the first patterned electrode. In addition, the mask for deposition and the manufacturing method thereof include removing the substrate and the first and second patterned electrodes.

In a further aspect of the present disclosure, the mask for deposition and the manufacturing method thereof include the peripheral part of the mask having a thickness greater than that of the deposition part of the mask, so that it is possible to prevent the mask from being thermally deformed when the mask and the mask frame are welded together.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the present disclosure and together with the description serve to explain the principle of the disclosure.

In the drawings.

DETAILED DESCRIPTION

Figure 1:
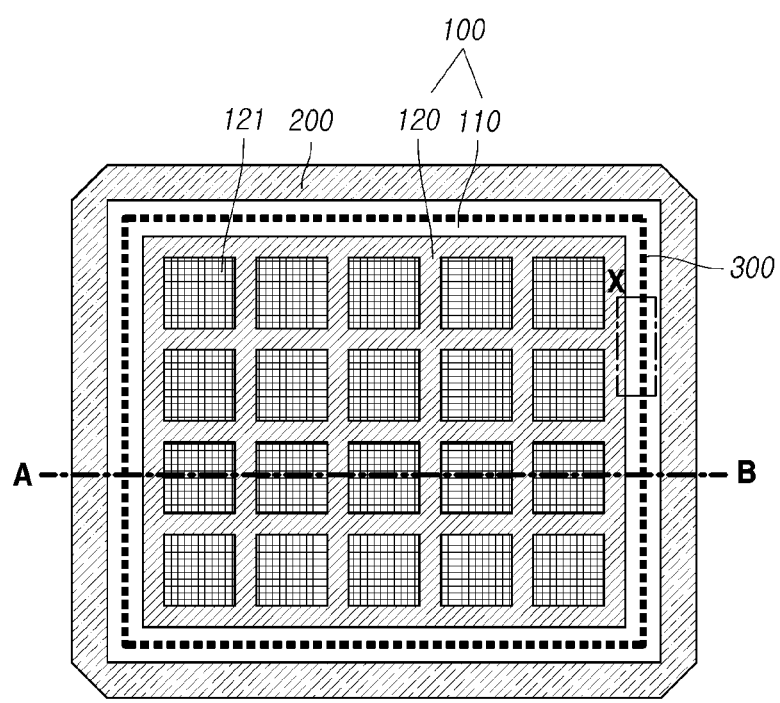
FIG. 1 is a schematic plan view of a mask and a mask frame according to aspects of the present disclosure.

Hereinafter, aspects of the present disclosure will be described in detail with reference to the accompanying drawings. The following aspects are provided, by way of example, so that the idea of the present disclosure can be sufficiently transferred to those skilled in the art. Therefore, the present disclosure is not limited to the aspects as described below, and may be embodied in other forms. Also, in the drawings, the size, thickness, and the like of a device may be exaggeratedly represented for the convenience of description. Throughout the specification, the same reference numerals designate the same elements.

The advantages and features of the present disclosure and methods of achieving the same will be apparent by referring to aspects of the present disclosure as described below in detail in conjunction with the accompanying drawings. However, the present disclosure is not limited to the aspects set forth below, but may be implemented in various different forms. The following aspects are provided only to completely disclose the present disclosure and inform those skilled in the art of the scope of the present disclosure, and the present disclosure is defined only by the scope of the appended claims. Throughout the specification, the same or like reference numerals designate the same or like elements. In the drawings, the dimensions and relative sizes of layers and regions may be exaggerated for the convenience of description.

When an element or layer is referred to as being "above" or "on" another element, it can be "directly above" or "directly on" the other element or layer or intervening elements or layers may be present. In contrast, when an element is referred to as being "directly on" or "directly above" another element or layer, there are no intervening elements or layers present.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the element in use or operation in addition to the orientation depicted in the figures. For example, if the element in the figures is turned over, elements described as "below" or "beneath" other elements would then be oriented "above" the other elements. Thus, the exemplary term "below" can encompass both an orientation of above and below.

FIG. 1 is a schematic plan view of a mask and a mask frame according to aspects of the present disclosure. Referring to FIG. 1, the mask 100, according to the aspects of the present disclosure, includes a peripheral part 110 and a deposition part 120. The peripheral part 110 is disposed to surround the outside edge of the deposition part 120. Further, the peripheral part 110 includes a welding line 300 in a partial area thereof. A laser beam may be applied along the welding line 300 to weld the mask (100) and the mask frame (200) together. While the laser beam has been described as being applied to the welding line 300, the aspects of the present disclosure are not limited thereto, and various methods may be used along the welding line 300, such as pressurization, plasma treatment, heating type welding, etc. However, for the convenience of description, it will be exemplified that a laser beam is applied along the welding line 300 to weld the mask 100 and the mask frame 200 together.

The deposition part 120 includes a plurality of deposition patterns 121. The plurality of deposition patterns 121 may be disposed to be spaced apart from each other in the deposition part 120.

The mask frame 200 is provided on the periphery of the mask 100. The mask frame 200 may be coupled with the mask 100 and may serve to support the mask 100. The mask frame 200 may be made of metal, a synthetic resin, or the like. The mask frame 200 may have a rectangular shape and may have at least one opening.

While the mask frame 200 in FIG. 1 is illustrated as having a rectangular shape, the shape of the mask frame 200, according to the aspects of the present disclosure, is not limited thereto, and the mask frame 200 may have various shapes, such as a circular shape, a hexagonal shape, or the like.

The deposition part 120 of the mask 100 may be disposed to correspond to the opening of the mask frame 200. A deposition material having passed through the opening of the mask frame 200 may be deposited onto a substrate through the deposition patterns 121 of the mask 100.

FIG. 1 discloses the deposition patterns 121 having a mask pattern with a plurality of slits. However, it is apparent to those skilled in the art that the deposition patterns 121, according to the aspects of the present disclosure, are not limited thereto and various modifications thereof can be made. Namely, the deposition patterns 121 may have a mask pattern that is open at the front side, or may have a mask pattern with a dot shape. The number, arrangement, and shape of the deposition patterns 121 illustrated in FIG. 1 are illustrative only, and the aspects of the present disclosure are not limited thereto.

The metal mask 100 is generally manufactured using an electroforming method. A mask manufacturing method using electroforming will be described in brief. A patterned electrode is formed on a substrate. Photoresist is applied to the region of the substrate in which there is no electrode.

Thereafter, a metal electrode (anode) and the substrate having the patterned electrode are immersed in an electrolyte solution, and a current is applied thereto. As a result, the metal is plated onto the patterned electrode of the substrate, and thus a metal mask may be manufactured. The manufactured metal mask is welded to a mask frame using a laser. Thereafter, the substrate may be removed to form the mask welded to the mask frame.

Meanwhile, due to the small thickness (e.g., about 10 μm) of the mask formed by the aforementioned method, the mask may burst when the mask and the mask frame are welded together using the laser, and thus there is a difficulty in welding the mask to the mask frame. Furthermore, due to the small thickness of the mask, the region of the mask to which the laser beam is applied may be thermally deformed when the mask and the mask frame are welded together using the laser. The thermal deformation of the mask may cause a deformation of the deposition part of the mask and the deposition patterns thereof, which may lead to deterioration in the precision of a film to be deposited.

Moreover, due to the thermal deformation of the mask, a gap may be formed between the mask and a substrate for deposition, which causes a shadow effect. The shadow effect means a phenomenon in which a material is deposited onto an undesired region of the substrate on account of an increase in the gap between the mask 100 and the substrate onto which the material is deposited through the mask 100.

The mask 100, according to the aspects of the present disclosure, which is aimed at solving these problems, may include at least one pattern at the boundary between the peripheral part 110 and the deposition part 120 of the mask 100 to which a laser is applied. This configuration will be described below with reference to FIG. 2.

Figure 2:
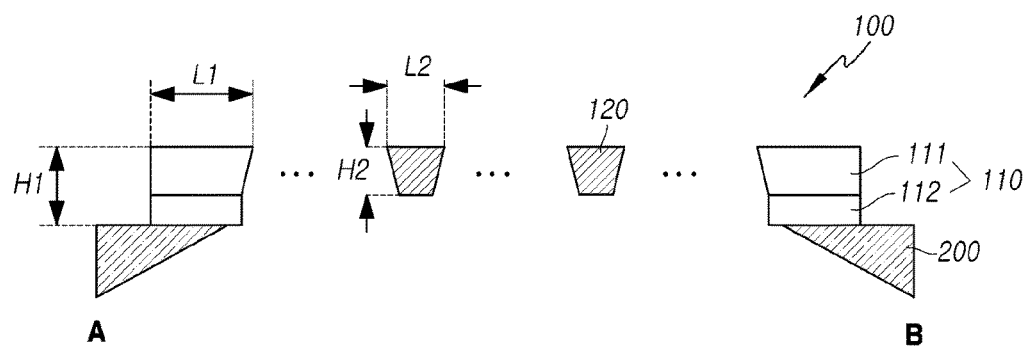
FIG. 2 is a partial cross-sectional view taken along line A-B of FIG. 1.

FIG. 2 is a partial cross-sectional view taken along line A-B of FIG. 1. Referring to FIG. 2, the mask 100, according to the aspects of the present disclosure, includes the peripheral part 110 and the deposition part 120.

The thickness H1 of the peripheral part 110 of the mask 100 may differ from the thickness H2 of the deposition part 120. Specifically, the thickness H1 of the peripheral part 110 of the mask 100 may be greater than the thickness H2 of the deposition part 120. The peripheral part 110 disposed to surround the deposition part 120 includes a welding line to which a laser is applied when the peripheral part 110 is welded to the mask frame 200.

Since the peripheral part 110 including the region to which the laser is applied has the thickness H1 greater than the thickness H2 of the deposition part 120 as illustrated in FIG. 2, it is possible to prevent the mask from being burst or thermally deformed even though the laser is applied to the peripheral part 110.

As described above, the mask 100 and the mask frame 200, according to the aspects of the present disclosure, may be welded together by laser welding. Specifically, one surface of the mask frame 200 may be welded to a part of a second region 112 of the peripheral part 110 of the mask 100. In this way, the mask frame 200 welded to the peripheral part 110 of the mask 100 may support the mask 100.

The mask 100, according to the aspects of the present disclosure, may have an extending part on one surface thereof, which is located at the boundary between the peripheral part 110 and the deposition part 120. The extending part may enhance the strength of the peripheral part 110 and the deposition part 120 of the mask 100 when the mask 100 and the mask frame 200 are welded together. The extending part will be described below with reference to FIG. 3.

Figure 3:
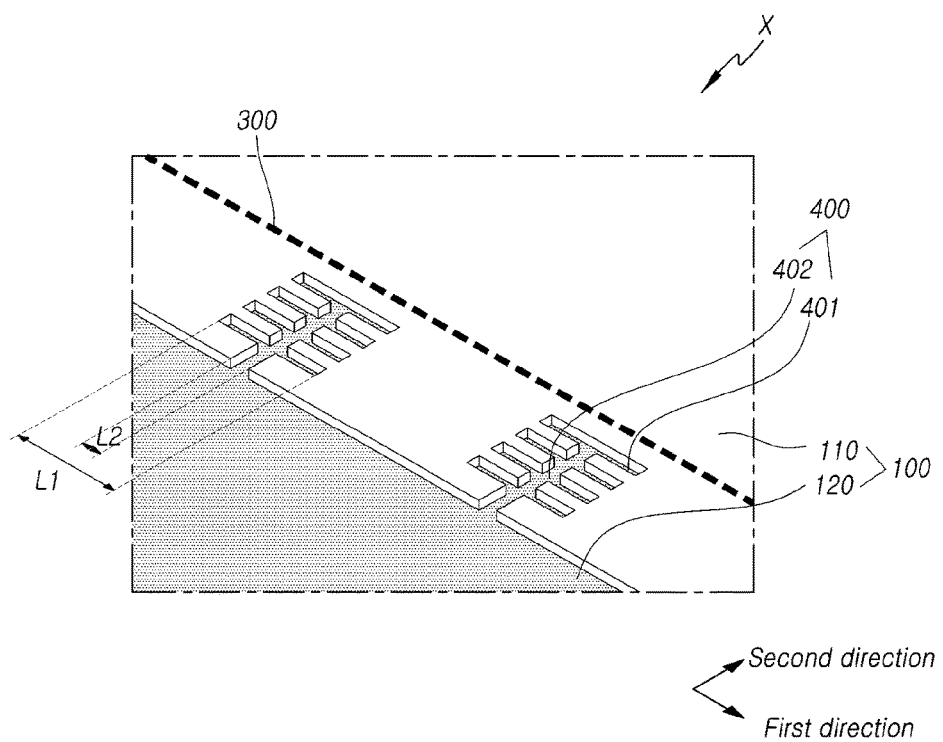
FIG. 3 is a view illustrating the boundary between the peripheral part and the deposition part of the mask including an extending part according to a first aspect.

FIG. 3 is a view illustrating the boundary between the peripheral part and the deposition part of the mask including an extending part according to a first aspect. FIG. 3 illustrates the region corresponding to region X of FIG. 1.

Referring to FIG. 3, the extending part 400 according to the first aspect may be provided at the boundary between the peripheral part 110 and the deposition part 120 of the mask 100. At least one extending part 400 may be provided at the boundary between the peripheral part 110 and the deposition part 120 of the mask 100.

The extending part 400 may extend from the deposition part 120 to the region in which the peripheral part 110 is located. In this case, the extending part 400 may have the same thickness as that of the deposition part 120. Namely, the thickness of the extending part 400 may be smaller than that of the peripheral part 110. Due to this, the thin extending part 400 is stopped by the thick peripheral part 110 to prevent the deposition part 120 of the mask 100 from moving when the mask 100 and the mask frame are welded together.

Specifically, the mask 100 is welded to the mask frame with a laser while being pulled in the direction perpendicular to the thickness direction thereof. At this time, the peripheral part 110 and the deposition part 120 of the mask 100 may be partially thermally deformed by the laser applied to the mask 100.

The thermal deformation may cause warpage in some regions of the peripheral part 110 and the deposition part 120 of the mask 100. The warpage of the peripheral part 110 and the deposition part 120 of the mask 100 may degrade the precision of deposition in a deposition process using the mask 100.

Accordingly, it is necessary to prevent the warpage of the peripheral part 110 and the deposition part 120 of the mask 100. To achieve this, the mask 100, according to the aspects of the present disclosure, includes the at least one extending part 400 at the boundary between the peripheral part 110 and the deposition part 120 thereof so that the extending part 400 can be stopped by the peripheral part 110 to enhance the strength of the mask 100 at the boundary between the peripheral part 110 and the deposition part 120. In other words, since the extending part 400 is thinner than the peripheral part 110, the thin extending part 400 is stopped by the thick peripheral part 110 so that the extending part 400 cannot move.

The extending part 400, according to the first aspect, includes at least one first pattern 401 extending in a first direction and a second pattern 402 extending in a second direction crossing the first direction. In this case, the first and second patterns 401 and 402 may have a bar shape.

Specifically, as illustrated in FIG. 3, a plurality of first patterns 401 (for example, four first patterns 401) extending in the first direction may be disposed to be spaced apart from each other, and the second pattern 402 extending in the second direction may be disposed to overlap the first patterns 401. Namely, the plurality of first patterns 401 may be connected with each other through the second pattern 402.

In this case, the first direction in which the first patterns 401 extend is the same as the direction in which the welding line 300 extends. The width L1 of the first patterns 401 may be greater than the width L2 of the second pattern 402 based on the direction in which the welding line 300 extends. Namely, in FIG. 3, the first pattern 401 may have four sub-patterns and one of the sub-patterns of the extending part 400, which is farthest from the deposition part, may be disposed to be closer to the welding line 300.

In other words, the first pattern 401 of the extending part 400 may be located closer to the welding line 300 since the width L1 of the first pattern 401 of the extending part 400 is greater than the width L2 of the second pattern 402 of the extending part 400 based on the direction in which the welding line 300 extends.

Since the mask 100 is welded to the mask frame by applying a laser along the welding line 300, the largest thermal deformation may happen in the region of the mask 100 adjacent to the welding line 300. The mask 100, according to the first aspect, has a configuration in which the first pattern 401 of the extending part 400 that has a large width (based on the direction in which the welding line extends) is disposed adjacent to the welding line 300, which makes it possible to further enhance the strength of the boundary portion between the peripheral part 110 and the deposition part 120 of the mask 100.

Specifically, the mask 100 is welded to the mask frame with stress applied to the mask 100 in the direction perpendicular to the thickness direction of the mask 100. The mask 100 may be thermally deformed by a laser applied when the mask 100 and the mask frame are welded together, and larger stress may be applied to the mask 100 in the direction perpendicular to the thickness direction of the mask 100 at the same time.

The extending part 400 of the mask 100, according to the first aspect, has a large width in the region adjacent to the welding line 300. Accordingly, even though stress is applied to the mask 100 in the direction perpendicular to the thickness direction of the mask 100, it is possible to enhance the strength of the mask in the region adjacent to the welding line 300 since a large surface area of the extending part 400 is stopped by the peripheral part 110 in the direction perpendicular to the stress, which is applied to the mask 100, in the region where the largest thermal deformation may happen.

Figure 4:
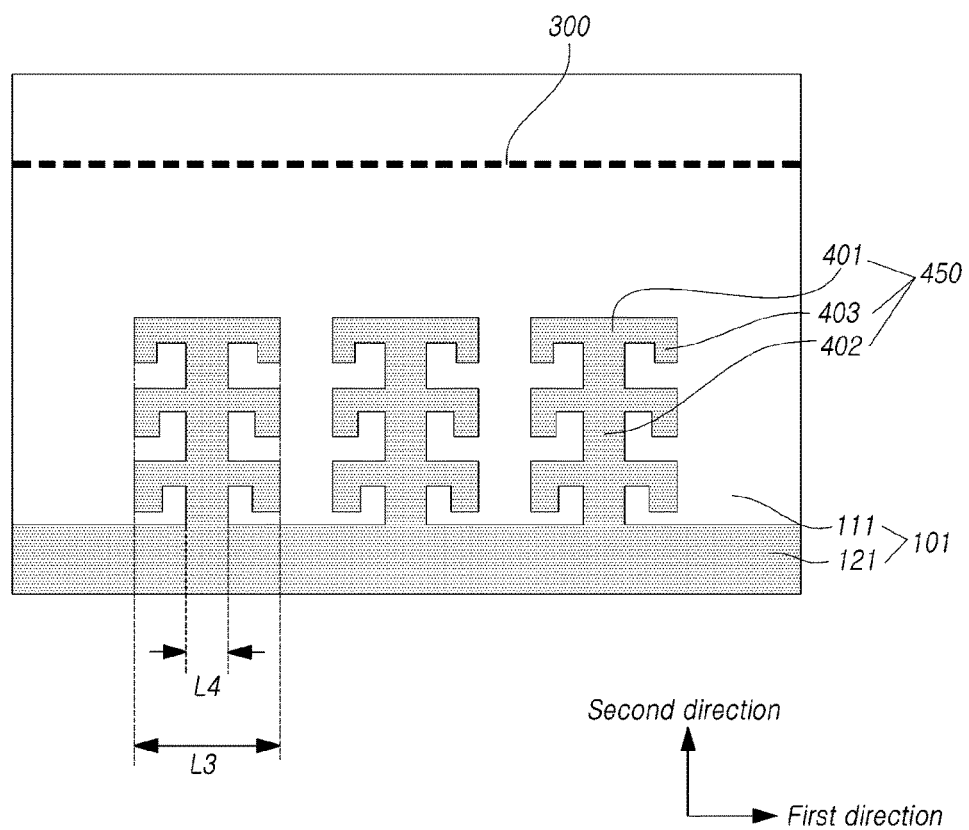
FIG. 4 is a view illustrating the boundary between a peripheral part and a deposition part of a mask including an extending part according to a second aspect.
Figure 5:
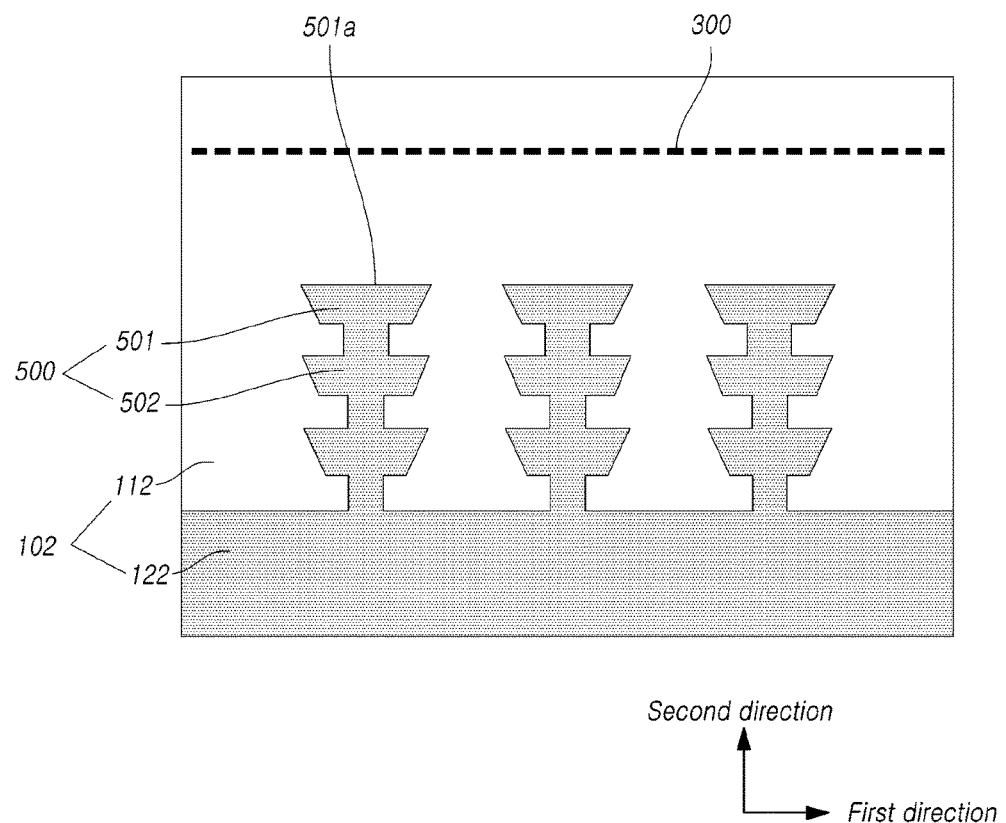
FIG. 5 is a view illustrating the boundary between a peripheral part and a deposition part of a mask including an extending part according to a third aspect.
Figure 6:
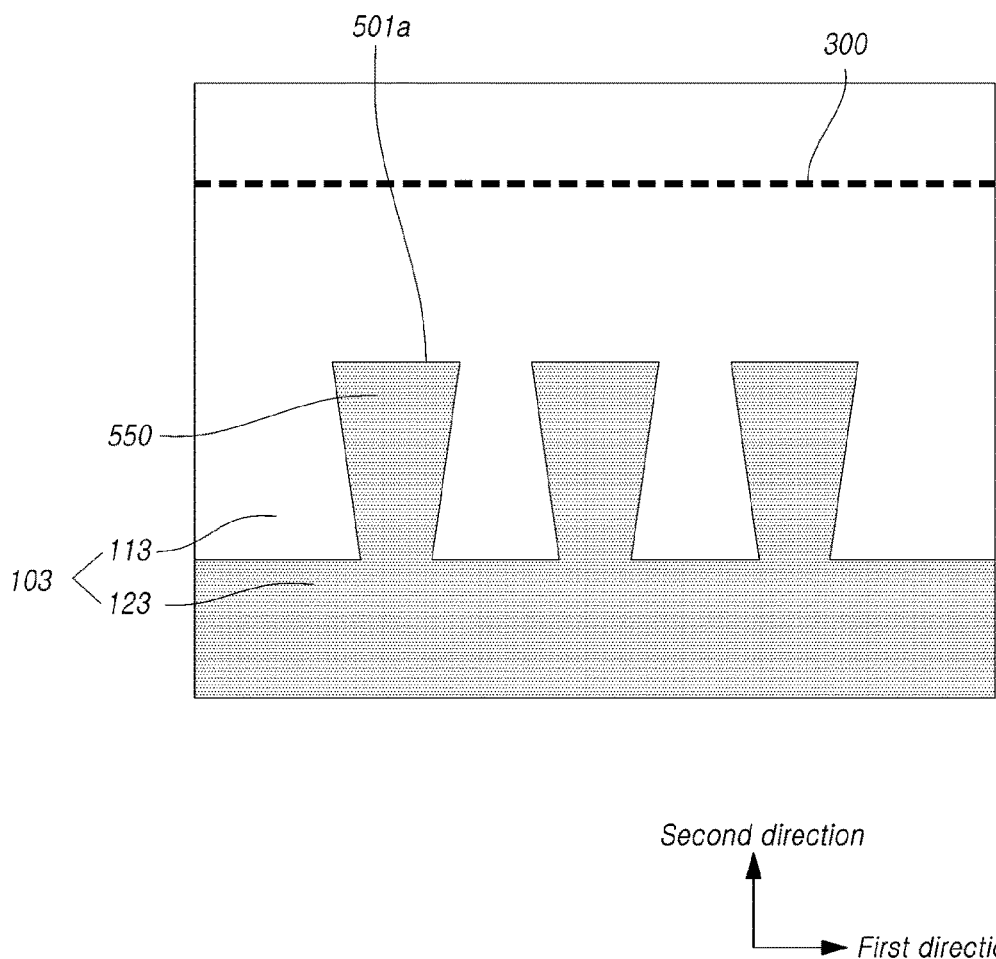
FIG. 6 is a view illustrating the boundary between a peripheral part and a deposition part of a mask including an extending part according to a fourth aspect.

The shape of the extending part 400 described above is not limited thereto, and the extending part 400 may be configured as illustrated in FIGS. 4 to 6. FIG. 4 is a view illustrating the boundary between a peripheral part and a deposition part of a mask including an extending part according to a second aspect.

Referring to FIG. 4, the extending part 450 according to the second aspect may be provided at the boundary between the peripheral part 111 and the deposition part 121 of the mask 101. At least one extending part 450 may be provided at the boundary between the peripheral part 111 and the deposition part 121 of the mask 101.

The extending part 450 may extend from the deposition part 121 to the region in which the peripheral part 111 is located. In this case, the extending part 450 may have the same thickness as that of the deposition part 121. Namely, the thickness of the extending part 450 may be smaller than that of the peripheral part 111.

The extending part 450, according to the second aspect, includes at least one first pattern 401 extending in a first direction and a second pattern 402 extending in a second direction crossing the first direction. The first pattern 401 includes at least one protrusion 403 on at least one end thereof that extends in the second direction.

Specifically, as illustrated in FIG. 4, a plurality of first patterns 401 (for example, three first patterns 401) that extend in the first direction and have at least one protrusion 403 on one end thereof may be disposed to be spaced apart from each other, and the second pattern 402 extending in the second direction may be located in the centers of the first patterns 401. Namely, the plurality of first patterns 401 may be connected with each other through the second pattern 402.

In this case, the first patterns 401 of the extending part 450 may be located close to a welding line 300 since the width L1 of the first patterns 401 of the extending part 450 is greater than the width L2 of the second pattern 402 of the extending part 450 based on the direction in which the welding line 300 extends.

The extending part 450, according to this aspect, has at least one protrusion 403 on at least one end of each first pattern 401. Accordingly, even though stress is applied to the mask 101 in the direction perpendicular to the thickness direction of the mask 101 when the mask 101 is welded to a mask frame, it is possible to enhance the strength of the mask in the region adjacent to the welding line 300 since a large surface area of the extending part 450 is stopped by the peripheral part 111.

FIG. 5 is a view illustrating the boundary between a peripheral part and a deposition part of a mask including an extending part according to a third aspect.

Referring to FIG. 5, at least one extending part 500, according to the third aspect, may be provided at the boundary between the peripheral part 112 and the deposition part 122 of the mask 102. The extending part 500, according to the third aspect, includes at least one first pattern 501 extending in a first direction and a second pattern 502 extending in a second direction crossing the first direction.

Specifically, as illustrated in FIG. 5, a plurality of first patterns 501 (for example, three first patterns 501) extending in the first direction may be disposed to be spaced apart from each other, and the second pattern 502 extending in the second direction may be located in the centers of the first patterns 501. Namely, the plurality of first patterns 501 may be connected with each other through the second pattern 502.

In this case, the first patterns 501 may have a trapezoidal shape. The first patterns 501 may be arranged such that the surfaces 501a of the first patterns 501 that have the maximum width face a welding line 300. By arranging the first patterns 501 such that the surfaces 501a of the first patterns 501 that have the maximum width face the welding line 300, it is possible to enhance the strength of the mask in the region adjacent to the welding line 300 even though stress is applied to the mask 102 in the direction perpendicular to the thickness direction of the mask 102, since a large surface area of the extending part 500 is stopped by the peripheral part 112 in the direction perpendicular to the stress, which is applied to the mask 102, in the region where the largest thermal deformation may happen.

While the first and second patterns of the extending parts in FIGS. 3 to 5 are illustrated as having a bar or trapezoidal shape, the first and second patterns of the extending parts according to the aspects of the present disclosure are not limited thereto and may have various shapes, such as a bar shape, a polygonal shape, or the like. Here, the widest surface of each extending part including the first and second patterns is disposed adjacent to the welding line so that it is possible to enhance the strength of the boundary portion between the peripheral part and the deposition part of the mask.

FIG. 6 is a view illustrating the boundary between a peripheral part and a deposition part of a mask including an extending part according to a fourth aspect.

Referring to FIG. 6, at least one extending part 550, according to the fourth aspect, may be provided at the boundary between the peripheral part 113 and the deposition part 123 of the mask 103. The extending part 550, according to the fourth aspect, may have a planar trapezoidal shape.

In this case, the surface 501a of the extending part 550 that has the maximum width may be disposed to face a welding line 300. By arranging the extending part 550 as described above, it is possible to enhance the strength of the mask in the region adjacent to the welding line 300 even though stress is applied to the mask 103 in the direction perpendicular to the thickness direction of the mask 103, since a large surface area of the extending part 550 is stopped by the peripheral part 113 in the direction perpendicular to the stress, which is applied to the mask 103, in the region where the largest thermal deformation may happen.

As illustrated in FIGS. 3 to 6, the extending parts 400, 450, 500, and 550, according to the aspects of the present disclosure, may be provided at the boundaries between the peripheral parts 110, 111, 112, and 113 and the deposition parts 120, 121, 122, and 123 of the masks 100, 101, 102, and 103. The extending parts 400, 450, 500, and 550 may have various shapes.

The widths of the surfaces of the extending parts 400, 450, 500, and 550 that are located closest to the welding lines 300 may be greater than those that are located farthest away from the welding lines 300. Accordingly, large surface areas of the extending parts 400, 450, 500, and 550 may be stopped by the peripheral parts 110, 111, 112, and 113 even though stress is applied to the masks 110, 101, 102, and 103 in the direction perpendicular to the thickness direction thereof when the masks 100, 101, 102, and 103 are welded to mask frames. Thus, it is possible to enhance the strength of the masks 100, 101, 102, and 103 in the regions adjacent to the welding lines 300, thereby preventing a deformation of the masks 100, 101, 102, and 103 when the masks are welded to the mask frames.

Next, a method of forming the masks and the mask frames, according to the aspects of the present disclosure, will be described below. FIGS. 7 to 13 illustrate a process of forming the mask according to the first aspect and a process of welding the mask frame to the mask.

Figure 7:
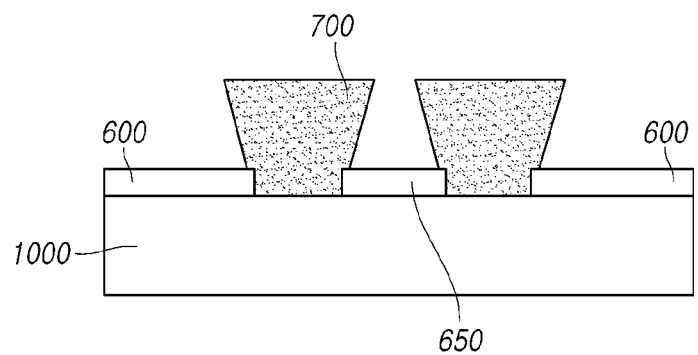
FIGS. 7 to 13 illustrate a process of forming the mask according to the first aspect and a process of welding a mask frame to the mask.

Referring to FIG. 7, an electrode material layer is formed on a substrate 1000 and then patterned. Among the patterned electrodes 600 and 650, the patterned electrode 600 (hereinafter, referred to as the first patterned electrode) disposed on the periphery of the substrate 1000 may be a region corresponding to the peripheral part of the mask, and the remaining patterned electrode 650 (hereinafter, referred to as the second patterned electrode), other than the patterned electrode 600 disposed on the periphery of the substrate 1000, may be a region corresponding to the deposition part of the mask.

Photoresist is applied to the substrate 1000. The photoresist pattern 700 is left in the region except for the first and second patterned electrodes 600 and 650. In this case, the photoresist pattern 700 on the organic substrate 1000 may have an inverted tapered shape.

Figure 8:
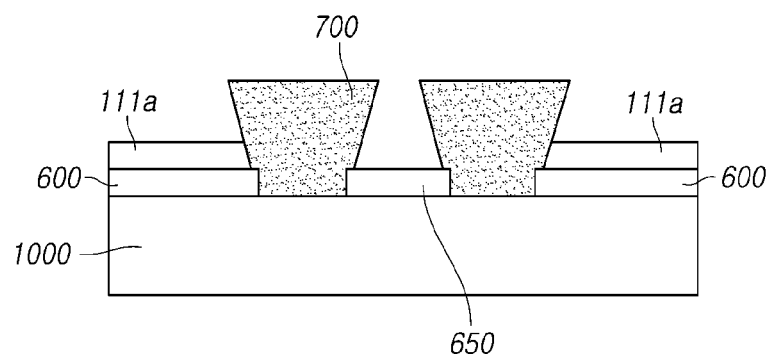

Referring to FIG. 8, a part of the mask is formed on the first patterned electrode 600 using an electroforming process (hereinafter, referred to as the primary electroforming process). The formed part of the mask may be a region corresponding to a part 111a of the first region of the mask peripheral part that will be formed later. Namely, in the primary electroforming process, only a part of the mask peripheral part that will be formed later is formed, and a region corresponding to the deposition part of the mask is not formed.

Figure 9:
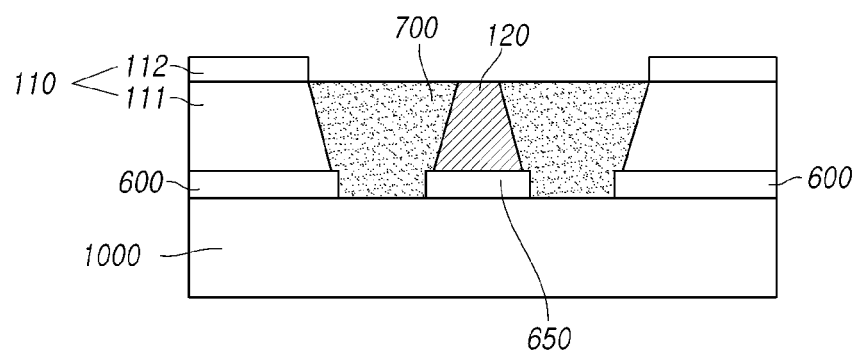

Referring to FIG. 9, the remaining part of the peripheral part 110 of the mask that will be formed later (specifically, the remaining part of the first region 111 and the second region 112 of the mask peripheral part) and the mask deposition part 120 are formed using an electroforming process (hereinafter, referred to as the secondary electroforming process).

The first region 111 of the peripheral part 110 and the deposition part 120 of the mask have a slope on at least one side thereof. Accordingly, at least one side of the first region 111 of the peripheral part 110 and at least one side of the deposition part 120 of the mask may make contact with the photoresist pattern 700 having an inverted tapered shape, and the lateral surface of the first region 111 of the peripheral part 110 of the mask and the lateral surface of the deposition part 120 of the mask that make contact with the photoresist pattern 700 (the regions making contact with the lateral surface of the photoresist pattern having an inverted tapered shape) may have a slope. Thus, it is possible to adjust the size of the holes of the mask through which a material to be deposited passes.

As described above, the peripheral part 110 of the mask may be formed by the primary and secondary electroforming processes, and the deposition part 120 of the mask may be formed only by the secondary electroforming process. Namely, in the primary electroforming process, the second patterned electrode 650 in the region corresponding to the deposition part 120 of the mask should not be plated with metal, and therefore devices have to be provided to apply a current to the respective regions where the deposition part 120 and the peripheral part 110 of the mask are formed.

Figure 10:
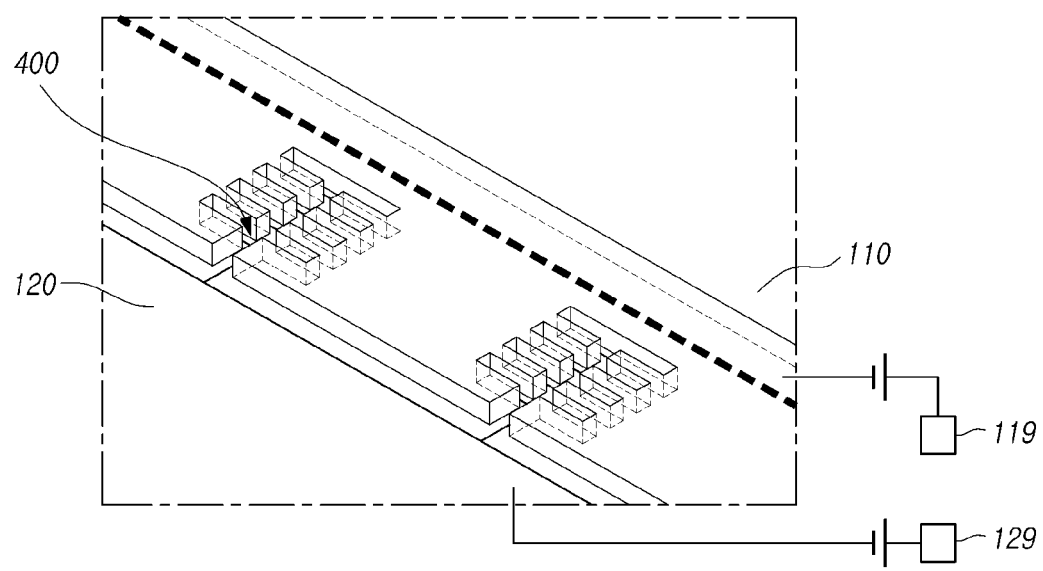

This configuration will be described with reference to FIG. 10. Referring to FIG. 10, the first patterned metal (cathode) 600 is plated through a first metal (anode) 119. The second patterned metal (cathode) 650 is plated through a second metal (anode) 129. Furthermore, the extending part 400 provided at the boundary between the deposition part 120 and the peripheral part 110 of the mask may be formed through the secondary electroforming process.

Namely, the extending part 400 is connected with the same current device as that for the deposition part 120, and the region corresponding to the extending part 400 is not plated by the primary electroforming process. Accordingly, the thickness of the extending part 400 may be the same as that of the deposition part 120 and may be smaller than that of the peripheral part 110.

The first and second metals 119 and 129 may include one or more of iron, nickel, copper, tin, gold, stainless steel, an Invar alloy, an Inconel alloy, a Covar alloy, an iron alloy, a nickel alloy, a nickel-phosphorus (Ni—P) alloy, and a nickel-phosphorus-polytetrafluoroethylene (Ni—P-PTFE) alloy, but this aspect is not limited thereto.

Therefore, the mask may also include one or more of iron, nickel, copper, tin, gold, stainless steel (SUS), an Invar alloy, an Inconel alloy, a Covar alloy, an iron alloy, a nickel alloy, a nickel-phosphorus (Ni—P) alloy, and a nickel-phosphorus-polytetrafluoroethylene (Ni—P-PTFL) alloy, but this aspect is not limited thereto.

Figure 11:
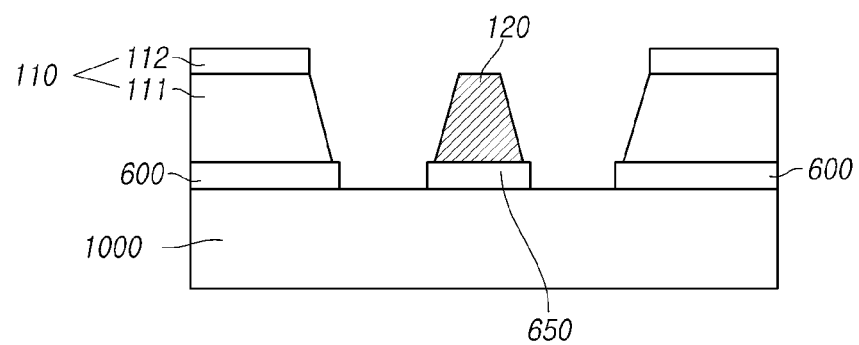

Referring to FIG. 11, the photoresist pattern formed on the substrate 1000 is removed. A part of the upper surface of the substrate 1000 may be exposed by removing the photoresist pattern. The exposed region of the upper surface of the substrate 1000 may be a region corresponding to the holes of the mask for passing a deposition material, which will be formed later.

Figure 12:
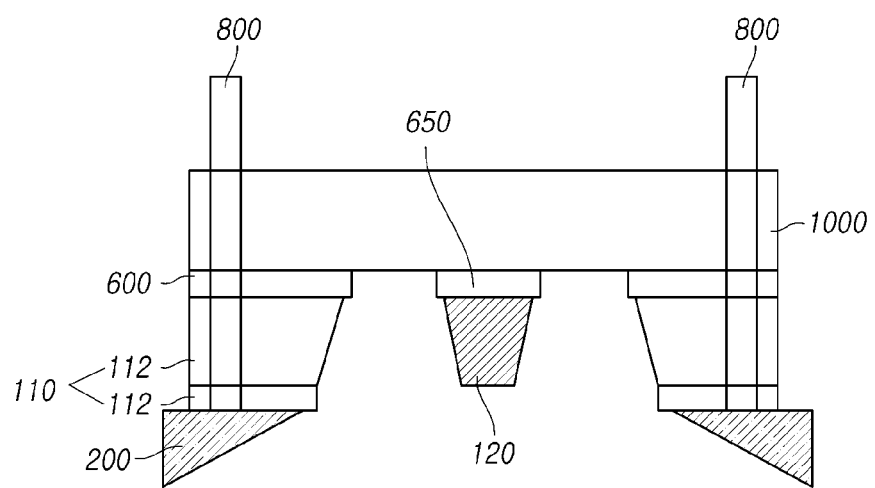

Referring to FIG. 12, the mask 100 and the mask frame 200 are welded together using a laser 800. The laser 800 may be applied along a laser welding line formed on the upper surface of the second region (reference numeral 112 of FIG. 11) of the mask 100.

Figure 13:
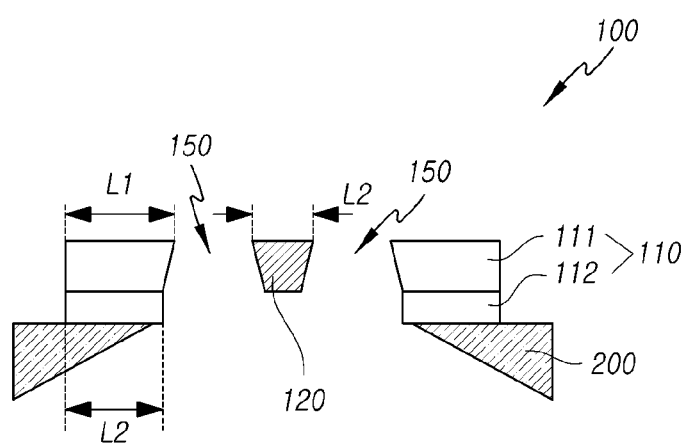

Referring to FIG. 13, the mask 100 and the mask frame 200 are finally formed by removing the substrate and the first and second patterned electrodes on the substrate after the mask 100 and the mask frame 200 are welded together.

In the finally formed mask 100, the area of the deposition part 120 that has the maximum width L2 and the area of the first region 111 of the peripheral part 110 that has the maximum width L1 may be located on the same plane. Here, the maximum width L2 of the deposition part 120 means the maximum width L2 of the deposition part 120 between a deposition pattern and another deposition pattern adjacent thereto, or means the maximum width L2 of the deposition part 120 between a deposition pattern and the peripheral part 110. The spaces between the area of the first region 111 of the mask peripheral part 110 that has the maximum width L1 and the area of the deposition part 120 that has the maximum width L2 may serve as holes 150 through which a deposition material passes, and the deposition material may be deposited onto a substrate (for example, a TFT substrate or a color filter substrate) through the holes 150.

As illustrated in FIGS. 7 to 9, the photoresist pattern 700 having an inverted tapered shape is formed on the substrate 1000 to correspond to the holes 150 of the mask 100. The holes 150 of the mask 100 may be finally formed to be large or small by adjusting the taper angle of the photoresist pattern 700, and the small-sized holes 150 are advantageous for forming fine patterns. Furthermore, different current devices may be connected to the first and second patterned electrodes 600 and 650, respectively, to form the extending part and the peripheral part 110 of the mask that have different thicknesses.

Figure 14:
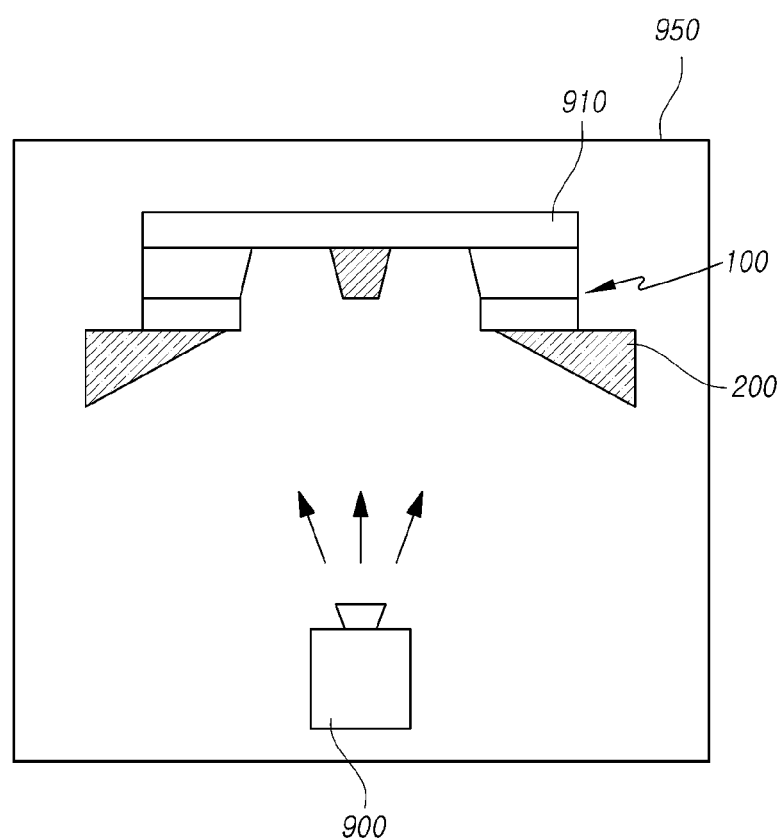
FIG. 14 is a partial view of a deposition apparatus equipped with the mask and the mask frame.

A process of depositing a material onto a substrate (for example, a TFT substrate or a color filter substrate) using the mask 100 and the mask frame 200 mentioned above will be described below. FIG. 14 is a partial view of a deposition apparatus equipped with the mask and the mask frame.

Referring to FIG. 14, the deposition apparatus includes a chamber 950 for providing a space in which a deposition process is performed on a substrate 910, a deposition material source 900 disposed within the chamber 950, the mask 100 disposed on one surface of the substrate 910, and the mask frame 200 welded to one surface of the mask 100.

In order to manufacture a high-resolution display device, it is important to reduce or remove a shadow effect that takes place during a deposition process. To this end, the gap between the substrate 910 and the mask 100 making contact with each other has to be minimized to prevent the mask 100 from being separated from the substrate 910. Namely, it is necessary to enhance the degree to which the substrate 910 and the mask 100 are brought into close contact with each other.

The mask 100, according to the present disclosure, has a configuration in which the peripheral portion welded to the mask frame 200 has a thickness greater than that of the deposition part. Thus, it is possible to prevent thermal deformation of the mask when the mask and the mask frame are welded together, thereby preventing separation between the mask 100 and the substrate 910.

Furthermore, it is possible to prevent a change in the positions of the deposition patterns on the mask by minimizing the thermal deformation of the mask 100 according to the present disclosure. Namely, the deposition material can be accurately deposited onto the substrate 910 by preventing the change in the positions of the deposition patterns on the mask when a deposition process is performed using the mask 100.

Particular characteristics, structures, or effects described in connection with the aspects are included in at least one aspect of the present disclosure and not necessarily in all aspects. Furthermore, the particular characteristics, structures, or effects of any specific aspect of the present disclosure may be combined in any suitable manner with one or more other aspects or may be changed by those skilled in the art to which the aspects pertain. Therefore, it is to be understood that contents associated with such combination or change fall within the spirit and scope of the present disclosure.

Although the present disclosure has been described with reference to some exemplary aspects, it should be understood that these aspects are given by way of illustration only and do not limit the scope of the disclosure, and that various modifications, variations, and alterations can be made by those skilled in the art without departing from the spirit and scope of the disclosure. For example, the components specifically shown in the aspects can be modified. Further, it should be construed that differences associated with such modifications, variations, and alterations fall within the spirit and scope of the present disclosure defined by the accompanying claims.

What is claimed is:

1. A mask for depositing films comprising:
a deposition part having a plurality of deposition patterns;
a peripheral part surrounding and disposed outside the deposition part; and
at least one extending part disposed outside the deposition part and disposed at the peripheral part, wherein the at least one extending part has a thickness smaller than that of the peripheral part, each of the at least one extending part includes one or more first pattern and a second pattern overlapping a portion of the one or more first pattern, and each of the one or more first pattern is connected through the second pattern,
wherein the deposition part extends into the at least one extending part and is exposed by the one or more first pattern and the second pattern, wherein a portion comprising the one or more first pattern and the second pattern of the at least one extending part is removed and extended onto the deposition part where the plurality of deposition patterns is exposed.

2. The mask of claim 1, wherein the at least one extending part extends from the deposition part to a region in which the peripheral part is located.

3. The mask of claim 1, wherein the peripheral part has a thickness greater than that of the deposition part.

4. The mask of claim 1, wherein the at least one extending part has the same thickness as that of the deposition part.

5. The mask of claim 1, wherein the peripheral part has a maximum width when the plurality of deposition patterns is located to have a maximum width among the deposition patterns and between an outermost deposition pattern and the peripheral part.

6. The mask of claim 1, further comprising a welding line located at the peripheral part.

7. The mask of claim 6, wherein a surface of the at least one extending part that has a maximum width is adjacent to the welding line with respect to the direction in which the welding line extends.

8. The mask of claim 6, wherein the first pattern arranged is in a first direction and the second pattern arranged is in a second direction crossing the first direction.

9. The mask of claim 8, wherein the first direction of the first pattern extends to the same direction as the welding line extends.

10. The mask of claim 9, wherein the first pattern comprises at least one protrusion formed in at least one end of the first pattern thereof.

11. The mask of claim 9, wherein the first and second patterns have a bar or polygonal shape.

12. The mask of claim 1, wherein the at least one extending part has a trapezoidal shape.

13. The mask of claim 1, further comprising
a mask frame at the periphery of the mask,
wherein the mask frame is attached to one surface of the peripheral part.

* * * * *